United States Patent
Sogard

(10) Patent No.: US 6,628,503 B2
(45) Date of Patent: Sep. 30, 2003

(54) GAS COOLED ELECTROSTATIC PIN CHUCK FOR VACUUM APPLICATIONS

(75) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/808,210

(22) Filed: Mar. 13, 2001

(65) Prior Publication Data
US 2002/0130276 A1 Sep. 19, 2002

(51) Int. Cl.⁷ ............................ H01J 4/16; H01J 4/18
(52) U.S. Cl. ...................................................... 361/324
(58) Field of Search ........................................ 361/324

(56) References Cited

U.S. PATENT DOCUMENTS

| | | | |
|---|---|---|---|
| 4,213,698 A | 7/1980 | Firtion et al. | |
| 4,544,446 A | 10/1985 | Cady | |
| 4,551,192 A | 11/1985 | Di Milia et al. | |
| 4,565,601 A | 1/1986 | Kakehi et al. | |
| 4,603,466 A | 8/1986 | Morley | |
| 5,033,538 A | 7/1991 | Wagner et al. | |
| 5,230,741 A | 7/1993 | van de Ven et al. | |
| 5,417,408 A | 5/1995 | Ueda | |
| 5,530,616 A | * 6/1996 | Kitabayashi et al. | 361/234 |
| 5,548,470 A | 8/1996 | Husain et al. | |
| 5,564,682 A | 10/1996 | Tsuji | |
| 5,708,556 A | 1/1998 | van Os et al. | |
| 5,810,933 A | * 9/1998 | Mountsier et al. | 118/724 |
| 5,838,528 A | 11/1998 | Os et al. | |
| 6,278,600 B1 | * 8/2001 | Shamouilian et al. | 361/234 |
| 2002/0067585 A1 | 6/2002 | Fujiwara | |

FOREIGN PATENT DOCUMENTS

| | | |
|---|---|---|
| EP | 0693774 | 1/1996 |
| EP | 0840434 | 5/1998 |
| WO | WO 97/03495 | 1/1997 |

* cited by examiner

Primary Examiner—Bruce Anderson
(74) Attorney, Agent, or Firm—Liu & Liu

(57) ABSTRACT

An electrostatic pin chuck consisting of an annular array of gas inlets, located towards the periphery of the chuck, for providing a uniform distribution of cooling gas to a wafer held by the chuck. This uniform distribution of cooling gas results in a uniform transfer of heat from the wafer to the chuck. Two annular rims positioned towards the outer perimeter of the chuck, and separated by an annular array of vacuum pumpout ports connected through a manifold to a vacuum pump, help to prevent leakages of cooling gas by functioning as gas bearing seals. Varying the annular thickness of the inner and outer rim, vacuum pump pressure, and the space between the wafer and chuck all affect the leakage rate of cooling gas from the chuck.

7 Claims, 7 Drawing Sheets

GAS COOLED ELECTROSTATIC PIN CHUCK FOR VACUUM APPLICATIONS

BACKGROUND OF THE INVENTION

1. Field of the Invention

This invention relates in general to a chuck used to hold a substrate during semiconductor processing, and more particularly to a system and method for controlling and maintaining uniform temperature of the substrate by adjusting pressure of the cooling gas maintained between the chuck and the substrate.

2. Description of the Related Art

In processes involving the fabrication of semiconductor integrated circuits, electronic components, and devices, various support systems have been employed to support the substrate, such as a silicon wafer, during the processing of the wafer. In certain processes such as lithography, image quality considerations require that the wafer be held level by a chuck in such a way that its exposed surface is flat, with little distortion, which can cause image misalignment.

One type of support system employs a perimeter-clamping ring which extends along the periphery of the wafer to retain the wafer in place. The portion of the wafer beneath the ring is clamped tightly against a support member. In such a system, the clamping ring reduces the total available area for circuit formation since the peripheral edge of the wafer is generally covered by the ring. Further, distortion to the wafer surface may result from particles trapped between the wafer and the support member.

Another type of support system employs a vacuum to hold the wafer against a chuck. In the vacuum support system, the wafer is held against the chuck by the use of a vacuum pump, which reduces the interior pressure in the space between the chuck and the wafer to a point that is lower than the exterior gas pressure of the chamber environment, in which the support system operates. Many semiconductor production processes, such as plasma etching, are performed in a high vacuum chamber environment ($10^{-3}$ Torr or less). The vacuum support system typically cannot operate well in such high vacuum chamber environment because the vacuum support system requires that the chamber environment has a higher pressure than the interior of the support system in order to hold the wafer down against the chuck.

Another type of support system uses electrostatic forces to clamp a wafer to a support surface. Typically, in such a system, substantially all or all of the surface area of the wafer may become available for processing and the chuck can effectively be used in a high vacuum exterior environment. A typical electrostatic chuck includes a base having a surface on which the wafer is supported and an electrostatic member that is electrostatically biased with respect to the wafer by an electrical potential. The wafer is held in place against the chuck's support surface by electrostatic forces.

During wafer processing, heat is often generated, and it is often necessary to limit the maximum temperature rise of the wafer. It is also important to maintain temperature uniformity over the wafer surface. If there are excessive temperature variations across the wafer surface (often due to poor and/or non-uniform heat transfer), the wafer can become distorted. In a vacuum environment, the transfer of heat out of the wafer is less efficient, because the heat transfer is accomplished mainly by radiation. The support system often provides a way of cooling the wafer in an attempt to maintain substantially constant wafer temperature. If the contact surface between the chuck and the wafer is smooth, the contact area is sufficient, and the thermal conductivity of the chuck is high, a substantial amount of heat can be transported from the wafer to the chuck and out through a heat exchanger. If the contact surface of the wafer or chuck is rough or the contact area is limited, the heat transfer via the chuck can be substantially reduced. Achieving intimate contact between chuck and wafer is difficult. Furthermore, this condition is normally avoided because of the risk of particles being trapped between the chuck and wafer, possibly leading to wafer distortion. In this situation an inert gas such as Helium (He) can be used as a thermal conductor to fill the space between the wafer and the chuck in order to conduct heat out of the wafer via the underside of the wafer. A fluid could also be flowed between the wafer and the chuck substrate, to convectively cool the wafer. However, maintaining sufficient clamping force, and avoiding serious leaks to the surrounding vacuum, would be difficult.

U.S. Pat. No. 4,565,601 describes an electrostatic chuck and a method of controlling the temperature of a wafer being processed in a vacuum at a predetermined temperature. The electrostatic chuck clamps and supports the wafer both at its periphery and at interior points. A gas coolant is supplied to the gap between the chuck top and wafer bottom. The clamping region at the periphery provides a seal to prevent the flow of gas into the vacuum chamber. However, if the peripheral contact region does not make good contact with the back of the wafer, for example, due to particles trapped in between or a non-flat surface of the wafer, leakage into the chamber will occur. Also, according to the patent, it requires clamping of the chuck and the wafer at the periphery to provide a seal to prevent the flow of gas coolant into the ambient vacuum. In order for the seal to be effective, a significant amount of clamping pressure must be applied, which can potentially distort the wafer.

Electrogrip Inc., manufactures a Helium-cooled electrostatic chuck with a leak rate of 0.5–1.0 sccm, for 200 mm wafers and a gas pressure of 10 Torr. This is equivalent to a throughput of about 0.013 Torr-l/sec at atmospheric pressure, 760 Torr. In order to maintain a chamber pressure of 1 mTorr, typical of etching systems, with this leak rate a difficult to achieve such pumping speeds. However, for other applications, such as electron beam lithography, chamber pressures of $10^{-6}$ to $10^{-7}$ Torr or better are required. Maintaining these vacuum levels with such a chuck leak rate would require pump speeds of $10^3$ to $10^4$ times larger, which is no longer feasible.

A need exists for an electrostatic chuck that provides uniform transfer of heat over the entire working area of the wafer, minimizes leakage of cooling gas into the operating environment, and secures the wafer without distortion.

SUMMARY OF THE INVENTION

The present invention overcomes the drawbacks of the prior art by adding an annular array of gas inlets toward the periphery of an electrostatic chuck, to provide a uniform distribution of cooling gas to the held substrate, and a gas bearing seal at the wafer periphery. In one particular embodiment, the present invention provides a uniform distribution of gas to a wafer held by an electrostatic pin chuck that has an annular array of gas inlets located within an annular array of gas outlets at the periphery of the chuck. Gas entering from the array of gas inlets helps to equalize the cooling gas pressure in the chuck cavity. The uniform distribution of gas results in a uniform transfer of heat from the wafer. Two annular rims surrounding the annular array of gas outlets towards the outer perimeter of the chuck help to prevent leakages of gas into the vacuum by functioning as gas bearing seals.

The gas is supplied from a reservoir of sufficient size that essentially constant gas pressure between wafer and substrate is maintained, despite the loss of gas at the gas outlets.

DETAILED DESCRIPTION OF THE PREFERRED EMBODIMENT

This invention is described in a preferred embodiment in the following description with reference to the following figures. While this invention is described in terms of the best mode of achieving this invention's objectives, it will be appreciated by those skilled in the art that variation may be accomplished in view of these teachings without deviating from the spirit or scope of the invention.

Figure 1:
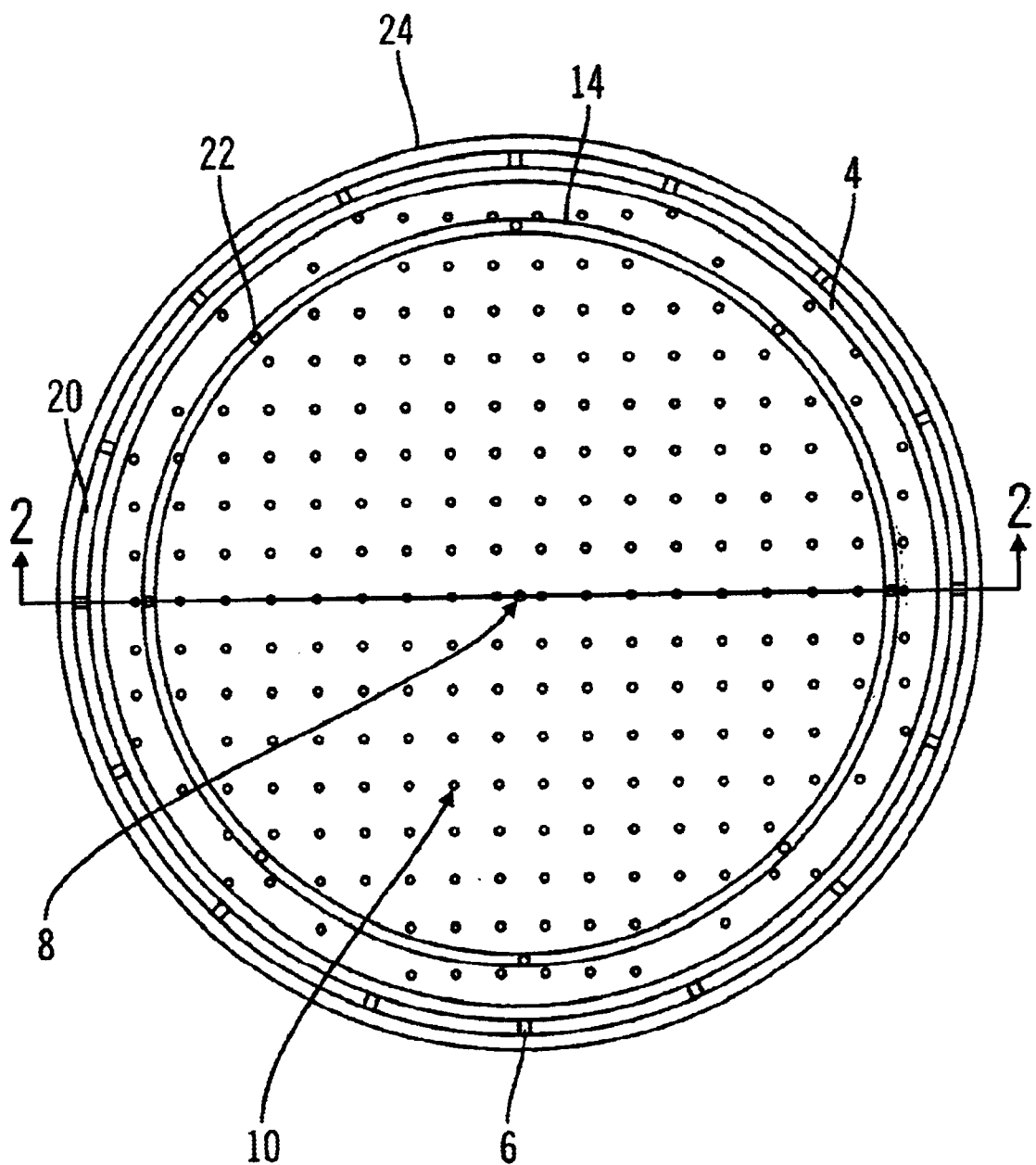
FIG. 1 is a top view of a wafer pin chuck in accordance with one embodiment of the present invention.
Figure 2:
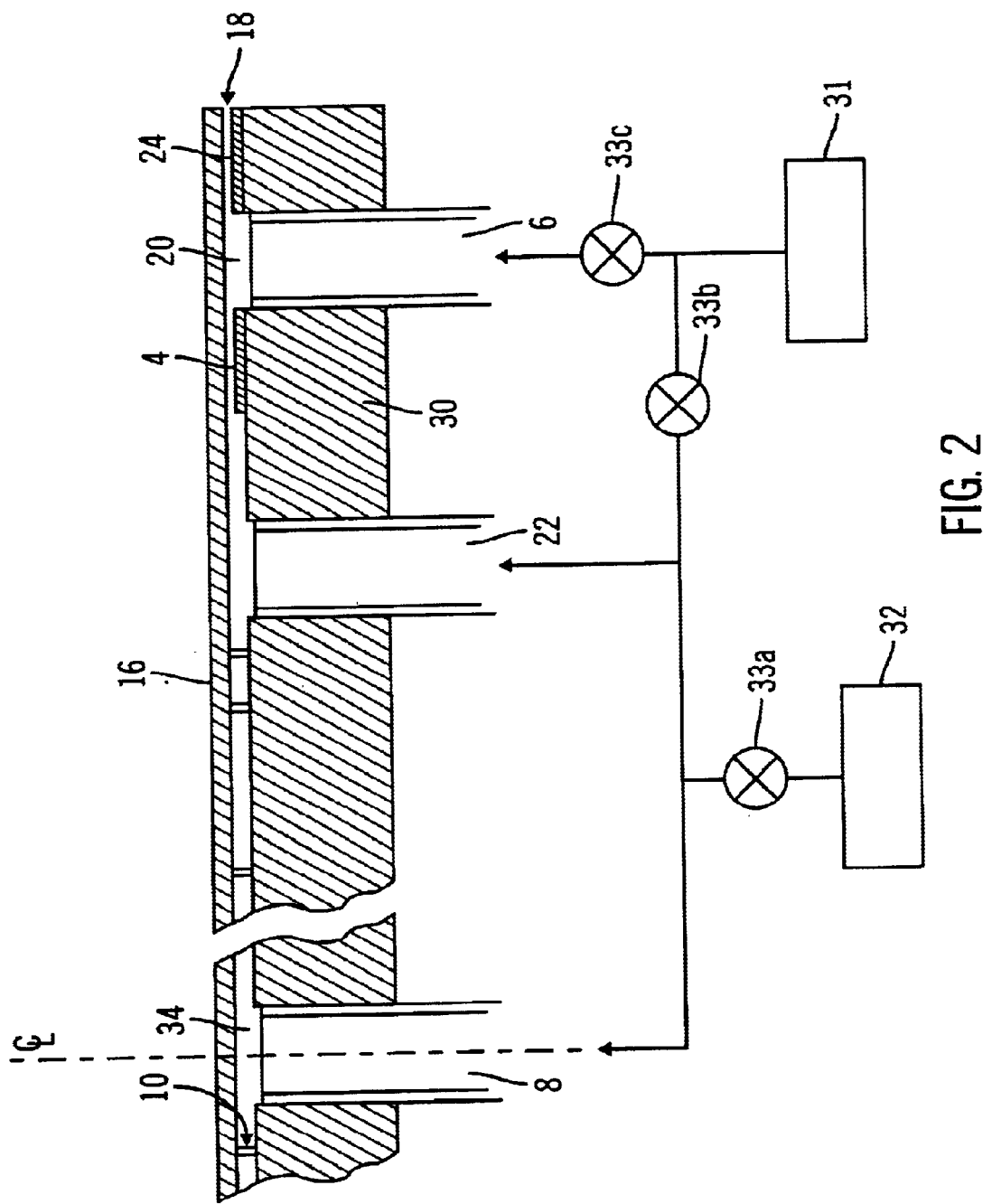
FIG. 2 is a sectional view of a wafer pin chuck taken along line 2—2 in FIG. 1.

Referring now to the drawings, FIGS. 1 and 2 are different views of a gas cooled electrostatic pin chuck for supporting a 300 mm diameter wafer. The geometry of the pin chuck should match the geometry of the substrate to be supported. The pin chuck described in this embodiment is for use with a round silicon wafer 16, therefore the base 30 is generally cylindrical. The height or thickness of the base 30 is sufficient enough to allow it to remain rigid under electrostatic operation in a vacuum or non-vacuum environment. Channels may be provided in the base 30 to provide a passageway for a cooling fluid or gas for removing heat from the chuck (not shown). In the base cavity 34 below the wafer 16, there is an array of regularly spaced support pins 10. The number and diameter of the support pins 10 are selected so that the wafer 16 is unlikely to trap dust particles between the support pin 10 and the supported wafer 10 and possibly induce distortion in the wafer 10. The total fraction of the wafer contacted by the pins should be less than about 5–10%.

Electrostatic chucks utilize the attractive force between two plates of a capacitor to hold the wafer in place. If the wafer is separated from the chuck by an insulator of dielectric constant $\epsilon$ and thickness d, and a voltage V is applied between them, an attractive force F is generated between them as follows:

$$F=(\epsilon V^2/2d^2)A,$$

where A is the common area of the wafer and chuck electrode. Clearly, in order to obtain a large attractive force for a given voltage, the distance d separating wafer and chuck must be minimized. Also high dielectric constants are an advantage. If a gap exists between wafer and chuck which is filled either with a low pressure gas or a vacuum, the dielectric constant is essentially that of free space $\epsilon_0$.

For a pin chuck, the wafer is supported on insulating pins. If the pins represent a fraction f of the wafer area, then the effective dielectric constant of the chuck becomes $F\epsilon+(1-f)\epsilon_0$, where $\epsilon$ is the dielectric constant of the pin material. If f is small, the dielectric constant is essentially $\epsilon_0$.

The gas introduced into the spaces between the wafer and chuck must provide sufficient thermal heat transfer to control the wafer temperature. At the same time, the gas pressure must be low enough that the attractive force holding the wafer to the chuck is not significantly diminished. As is known, the thermal conductivity of a gas is essentially independent of gas pressure as long as the mean free path of the gas molecules is small compared to the system dimensions. This fact permits using a gas at relatively low pressure in the chuck with little effect on heat transfer. This subject is discussed in more detail in U.S. patent application Ser. No. 09/266,705.

For all the considerations mentioned above, the gap between wafer and chuck surface should be kept to a minimum. In the preferred embodiment, and in the modeling calculations, this gap was maintained at 10 micron. For this gap, the heat transfer of He gas at 10 Torr pressure is not significantly different from its value at one atmosphere 760 Torr.

On the outer edge of the base 30 is an annular outer rim 24, within which an annular channel 20 containing an annular array of vacuum pumpout ports 6 is located. The vacuum pumpout ports 6 are connected by a manifold and hoses (not shown) to a vacuum pump 31. An annular inner rim 4 is positioned next to the annular channel 20. The width of the annular inner rim 4 and annular outer rim 24 is several millimeters and the height of each rim is several microns less than the height of the support pins 10, resulting in a gap 18 between the wafer 16 and the two rims 4, 24. This gap 18 is critical because it prevents contact of the wafer 16 to each rim 4, 24. The gap is larger than the size expected for typical particles in a semiconductor processing system. Thus, this structure reduces the possibility of particle-induced distortions in the wafer. Also since there is no clamping of the rims 4, 24 to the wafer 16 at the periphery, there is no distortion caused by any sealing or clamping pressure applied on those structures. On the other hand, the inner rim 4 and outer rim 24 can still function as a gas bearing seal when cooling gas is flowing through the base cavity 34, substantially reducing the gas leakage to the ambient environment.

Cooling gas is introduced from a pressure controlled gas source 32 through an array of inlets 22 arranged in an annular groove 14 located at approximately 15 mm or less from the inner rim 4. The inlets 22 are connected by a manifold and hoses (not shown) to a vacuum pump 31. A central gas inlet 8 may also be used in addition, to allow the gas pressure to equilibrate beneath the wafer more rapidly. It can also speed up the removal of the gas at the end of wafer processing when the wafer is about to be removed from the chuck. Given the small gap between wafer and chuck, additional ports may be needed for this purpose.

In operation valves 33a, 33b, and 33c are initially closed. The wafer is clamped to the chuck, and valves 33a and 33c are opened. A cooling gas such as Helium is introduced from the central gas inlet 8 and the gas inlets 22 holes via the circular pressure distribution groove 14 into the base cavity 34 defined by the under surface of the wafer 16 and the pin chuck surface. The pressure is distributed evenly throughout the surface of the wafer 16 except towards the inner rim 4, where a pressure gradient occurs. The pressure gradient occurs because the pressure at the vacuum pumpout ports 6 is lower than the pressure at points closer to the wafer center. The inner rim 4 and outer rim 24 function as a gas bearing seal as the gas flows through the base cavity 34. At the end of processing, valve 33a is closed and 33b is opened. The coolant gas is pumped out, valves 33b and 33c are closed, and the wafer is removed from the chuck.

Figure 3:
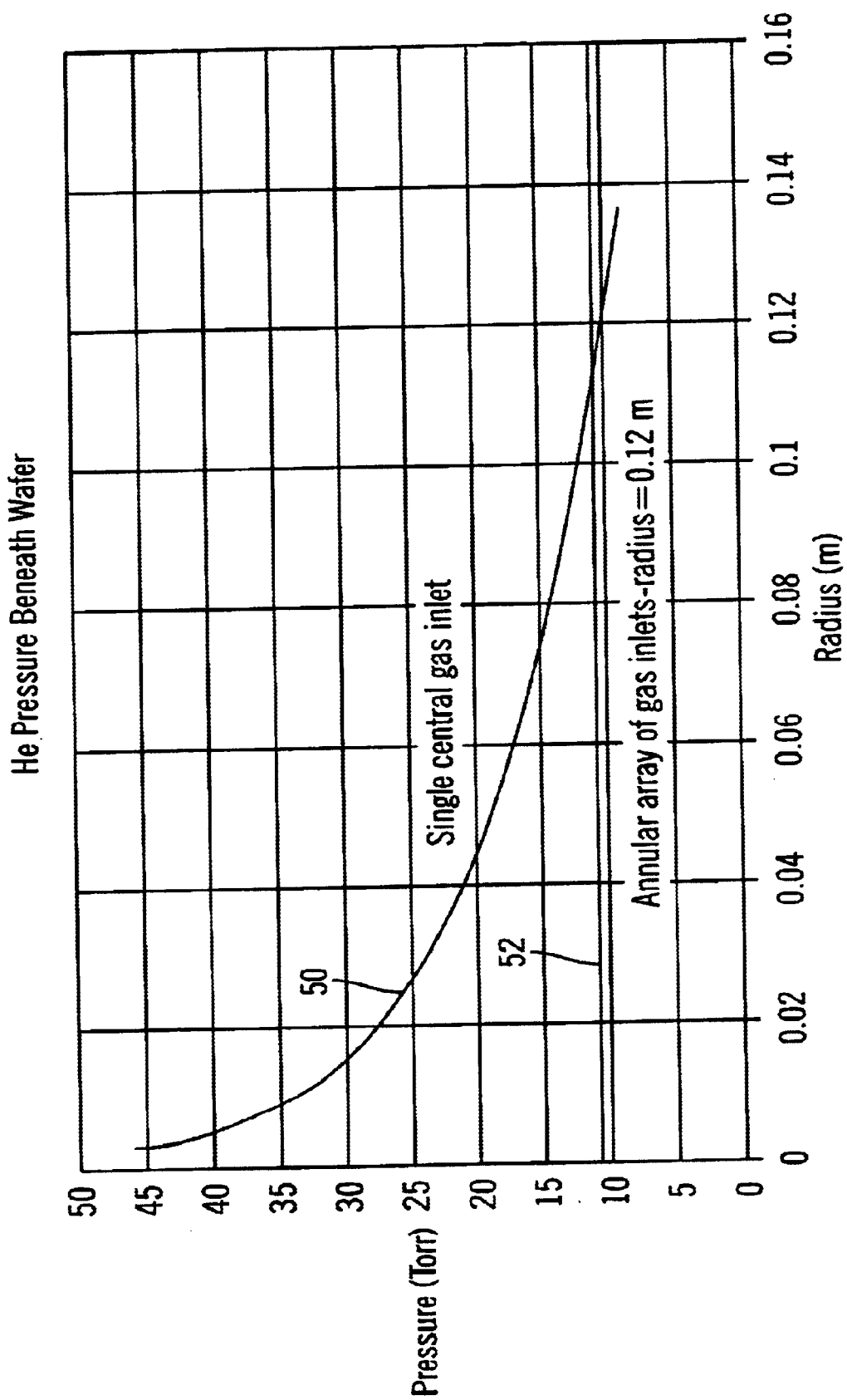
FIG. 3 is a graph comparing the Helium pressure beneath a wafer of a chuck with a single central gas inlet and one with an annular array of gas inlets.

FIG. 3 shows results obtained from numerically modeling gas flow between the chuck and wafer by representing the system by a finite number of conductance subsystems each with characteristics defined by its geometry and local gas pressures. The gas flows are determined from a series of conductance equations based on Kirchhoff's equations from circuit theory. The graph compares the numerical modeling results of the Helium pressure beneath the wafer for two differently configured chucks, one with a single central gas inlet and one configured with an annular array of gas inlets (i.e., inlets 14) located just inside of the rim 4. The Helium pressure (Torr) is referenced on the ordinate and the radius (m) of the wafer chuck is referenced on the abscissa. The input parameters for the modeling are as follows, 46 Torr for inlet pressure for the chuck with a single gas inlet, 11.2 Torr for the chuck with an annular array of inlets located at a radius of 0.120 m, and 0.01 Torr for the pressure at the vacuum pump 31 connected through a hose and manifold to the pumpout ports 6. The vacuum chamber surrounding the chuck is attached to a vacuum pump with a pumping speed of 1000 l/sec. In FIG. 3, a gap of 2 micron between the wafer bottom and the inner annular seal 4 was assumed. The Helium pressure distribution 50 under a wafer held with the chuck containing a single central gas inlet is not uniform. The pressure is higher towards the central gas inlet and lower towards the outer periphery, with approximate pressures of 46 Torr and 10 Torr, respectively. This uneven pressure distribution results in an uneven transfer of heat across the wafer (a direct relationship exists between the two parameters). As a result, the wafer will be cooled unevenly.

With a wafer chuck having an annular array of gas inlets 14, the Helium pressure distribution 52 is substantially uniform from the center of the wafer to the inner rim 4, at a distance of approximately 0.135 m, as measured from the center of the wafer towards its edge. Beyond approximately 0.135 m, the Helium pressure gradually decreases to the pressure at the vacuum pumpout ports 6. As demonstrated, the additional annular array of gas inlets allows the chuck to provide a uniform pressure of He gas across most of the wafer surface, which in turn results in a uniform heat transfer. While the heat transfer begins to decrease for radii greater than that of the annular gas inlets 14, the area of the wafer so affected amounts to only a few percent of the total. It can be further reduced by placing the annular array of inlets 14 and the inner rim 4 as close to the edge of the wafer as possible.

Figure 4:
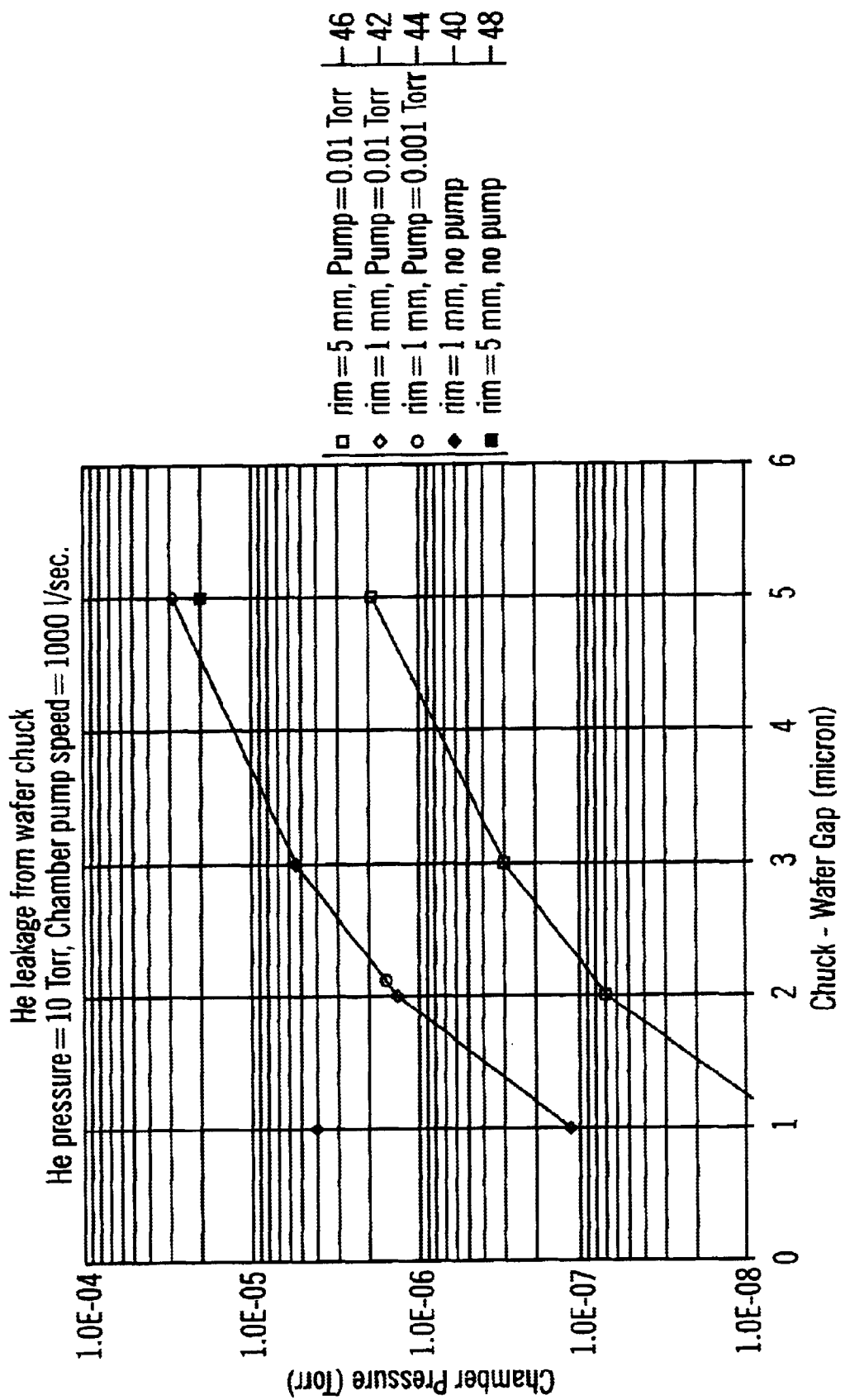
FIG. 4 is a graph comparing the Helium leakage from a wafer chuck configured with different rim thicknesses, wafer-chuck gaps, and vacuum pump pressures.

FIG. 4 show the results obtained from numerically modeling the chuck at various geometries and operating pressure conditions by representing the system by a finite number of conductance subsystems each with characteristics defined by its geometry and local gas pressures. The gas flows are determined from a series of equations based on Kirchhoff's equations. The graph shows the results of the leakage of cooling gas into the vacuum chamber for situations involving varying air bearing gaps, inner/outer annular rim radial thicknesses, and pump pressures for the annular pumpout ports of a wafer chuck. The wafer chuck was assumed placed in a vacuum chamber pumped by a 1000 l/sec. pump. The Helium pressure was set to 10 Torr and the inner and outer annular thicknesses were set to either 1 mm or 5 mm. The gap (microns) between the wafer bottom and the chuck is represented on the abscissa, and the resulting chamber pressure (Torr) is represented on the ordinate. Plot 46 shows that with a rim thickness of 5 mm and a Helium pump out pressure of 0.01 Torr at the vacuum pump, the vacuum chamber pressure increased from less than $1.0 \times 10^{-8}$ Torr to over $1.0 \times 10^{-6}$ Torr, as the gap between the wafer and rim increased from 1 $\mu$m to 5 $\mu$m, indicating a higher cooling gas leakage into the vacuum chamber. Data point 48 shows the same rim thickness at a wafer gap of 5 $\mu$m, and no vacuum pump, the chamber pressure increases to over $1.0 \times 10^{-5}$ Torr, which indicates a higher leak rate into the chamber than when the pumpout ports are used. When the annular rim thickness is reduced to 1 mm and the pumpout pressure set to 0.01 Torr, the chamber pressure is about $1.0 \times 10^{-7}$ Torr with a 1 $\mu$m gap and the chamber pressure increases as the gap increases (plot 42). With the rim still at 1 mm, no pumpout port, and the wafer gap at 1 $\mu$m, the chamber pressure increases to about $4.0 \times 10^{-6}$ Torr (data point 40). At a rim thickness of 1 mm, pumpout pressure at 0.001 Torr, and gap at 2.1 $\mu$m, the chamber pressure is about $1.6 \times 10^{-6}$ Torr (plot 44). The lower pumpout pressure has little effect on chamber pressure (compare plot 42).

The data from this numerical modeling indicate that with other parameters constant, as the gap between the wafer and inner/outer rim increases, the Helium gas leakage also increases. This is a result of a larger gap providing a larger cross sectional area for the gas to escape through. Secondly, as the annular thickness of the rims increase, the leakage decreases because of the increasing amount of rim surface area functioning as a gas bearing seal. Lastly, a reduction in pumpout pressure decreases Helium leakage, because a correspondingly lower pressure in the annular channel 20 reduces the flow of gas from the annular channel 20 across the seal 24 to the chamber. These different factors can be used as a reference when designing an optimum chuck configuration for a particular application.

The requirements for the vacuum pump 31 attached to the pumpout ports 6 are not too demanding. The gas throughput to the pump under the conditions represented by FIG. 3 is 0.0056 Torr-l/sec. In order to maintain the pressure at the entrance to the pump at 0.01 Torr, a pump speed of approximately 0.0056/0.01=0.56 l/sec is required. This speed is easily achieved with commercial pumps.

The gas escaping to the pumpout ports 6 and the vacuum chamber must be replaced from a source, or the gas pressure in the chuck, and the thermal conductivity, will decrease with time. Assuming the gas pressure in the chuck Pchuck to be much greater than the vacuum pump pressure, the gas flow from the chuck can be approximated by CPchuck, where C is the conductance of the inner annular seal 4. If V is the volume of the He gas between the wafer bottom and the top of the chuck, then in the absence of a gas source the gas pressure will decrease with time t like $\exp[-Ct/V]$. This relation is described in e.g. *A User's Guide to Vacuum Technology* by John F. O'Hanlon. Under the conditions represented in FIG. 3 the conductance is approximately 0.00057 l/sec, and the volume is approximately 0.00057 l. Consequently the time constant V/C, the time it takes the pressure to decrease to $e^{-1}$ of its initial value, is only about 1 sec. This is much too short a time for processing operations, so a gas source is needed to maintain the pressure constant.

In summary, the present invention provides a method of providing a uniform pressure of cooling gas to a wafer held by an electrostatic chuck, through the use of a pressure distribution groove containing an array of gas inlets. The uniform pressure of cooling gas results in uniform cooling of the wafer, which is important during the wafer processing stage. By providing a uniform wafer temperature, distortion of the features formed on the wafer can be reduced. The inner and outer rim in conjunction with the vacuum pumpout ports help to reduce the leakage of cooling gas, which allows the chuck to efficiently operate in chamber conditions that require vacuum pressures of $10^{-6}$ or lower.

Figure 5:
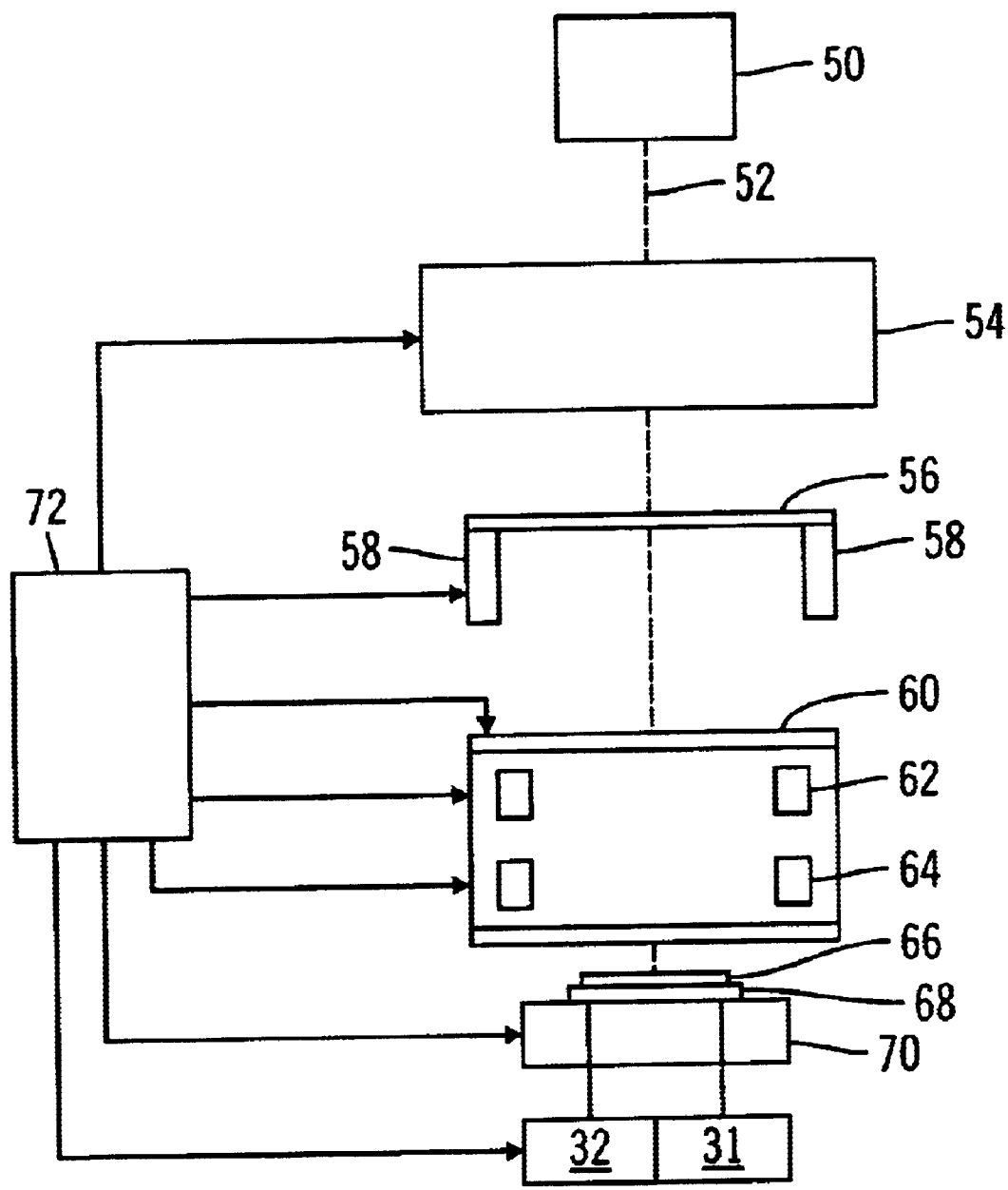
FIG. 5 is a schematic view of a typical electronic beam lithography system incorporating the pin chuck system in accordance with the principles of the present invention.

There are many different types of lithographic devices in which the present invention may be deployed. Referring to FIG. 5, an example of a lithographic device is an electron beam lithography apparatus that comprises an electron gun 50, illumination system 54, a reticle stage 58, a wafer stage 70, and a projection system 60. The illumination-optical system 54 is situated and configured to illuminate, with a charged-particle illumination beam 52, a region of a reticle 56 defining a pattern to be transferred to a substrate 66. The reticle stage 58 is situated and configured to hold and move the reticle 56 in the path of the illumination beam 52. (The illumination beam passing through the reticle carries an image of the illuminated region.) The wafer stage 70 supports a gas cooled electrostatic pin chuck in accordance with the present invention (such as the pin chuck 68 in the illustrated embodiment), which is situated and configured to hold and move the substrate 66 for exposure with the reticle pattern by the imaging beam 52. The pin chuck 68 is connected to a gas source 32 and vacuum pump 31 by appropriate plumbing and valves schematically represented in FIG. 2. A projection system 60 is situated between the reticle stage 58 and the wafer stage 70, and configured to project an image of the reticle on an exposure surface of the sensitive substrate 66. The projection system 60 comprises an electromagnetic deflector 62 (may include a plurality of defector plates for controlling beam deflection in two axes) situated and configured to deflect the beam so as to increase an area exposed by the pattern beam on the exposure surface. The projection system 60 also includes an electrostatic deflector 64 situated and configured to deflect the patterned beam sufficiently to correct a position error of the wafer stage 70 or the reticle stage 58, or both stages, and thereby adjusting a pattern transfer position on the exposed surface. The apparatus also includes a controller 72 controlling the operations of the illumination system 54, the projection system 60, the reticle stage 58, the wafer stage 70, the electromagnetic deflector 62, the electrostatic deflector 64, the vacuum pump 31 and gas source 32 and associated valves.

The controller 72 is configured to move the wafer stage 70 continuously during an exposure shot of the patterned beam on the surface of the substrate 66, and to energize the electrostatic deflector 64 during the exposure shot to correct the pattern-transfer position during the shot. Although the disclosed invention is focused on a gas cooled chuck for a vacuum processing system, such as the electron beam lithography apparatus described above, the chuck can also be used in a non-vacuum processing system.

Figure 6:
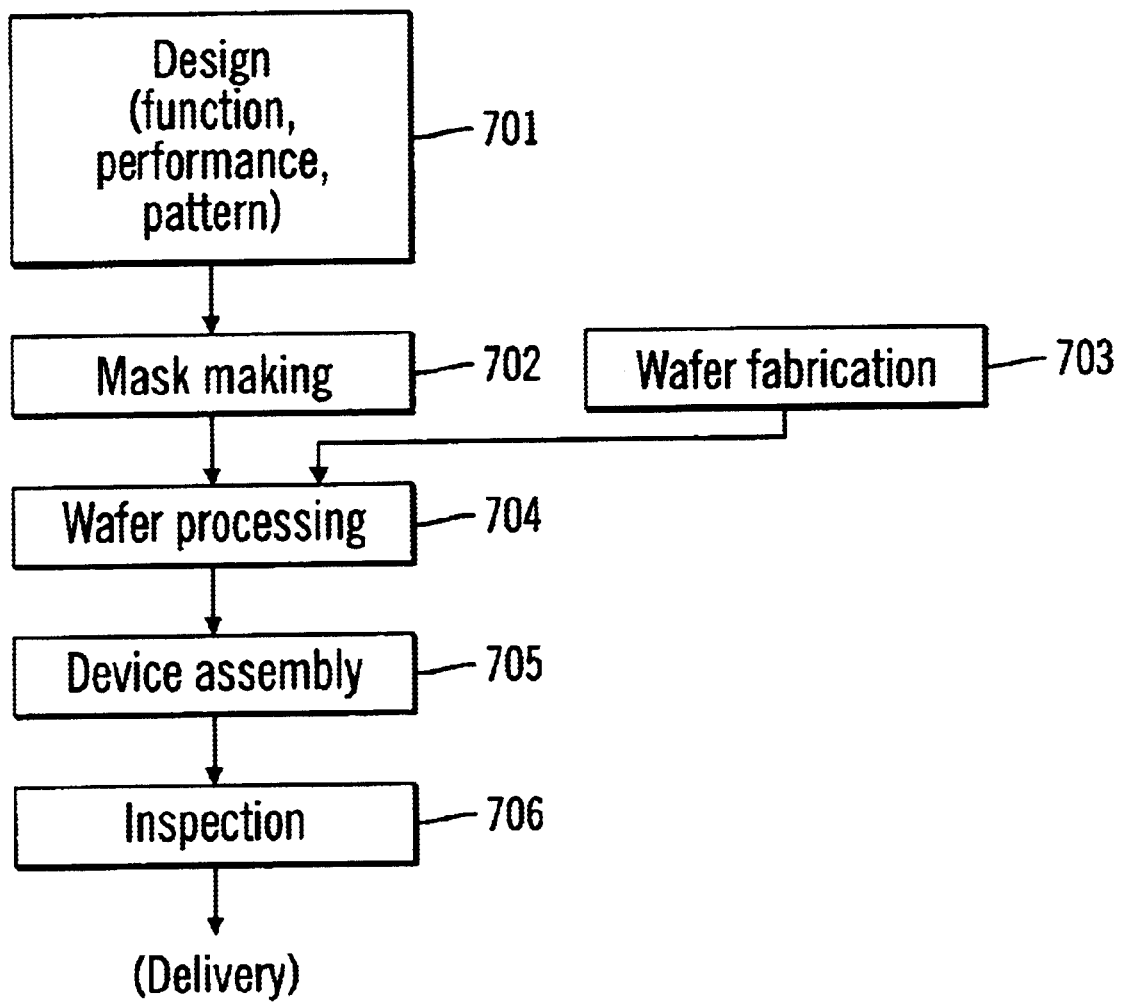
FIG. 6 is a block diagram of a general fabrication process for semiconductor devices.

Further, semiconductor devices can be fabricated using the above described system, by the process shown generally in FIG. 6. In step 701 the device's function and performance characteristics are designed. Next, in step 702, a mask (reticle) having a pattern is designed according to the previous designing step, and in a parallel step 703 a wafer is made from a silicon material. The mask pattern designed in step 702 is exposed onto the wafer from step 703 in step 704 by a photolithography system described hereinabove in accordance with the present invention. In step 705 the semiconductor device is assembled (including the dicing process, bonding process and packaging process), then finally the device is inspected in step 706.

Figure 7:
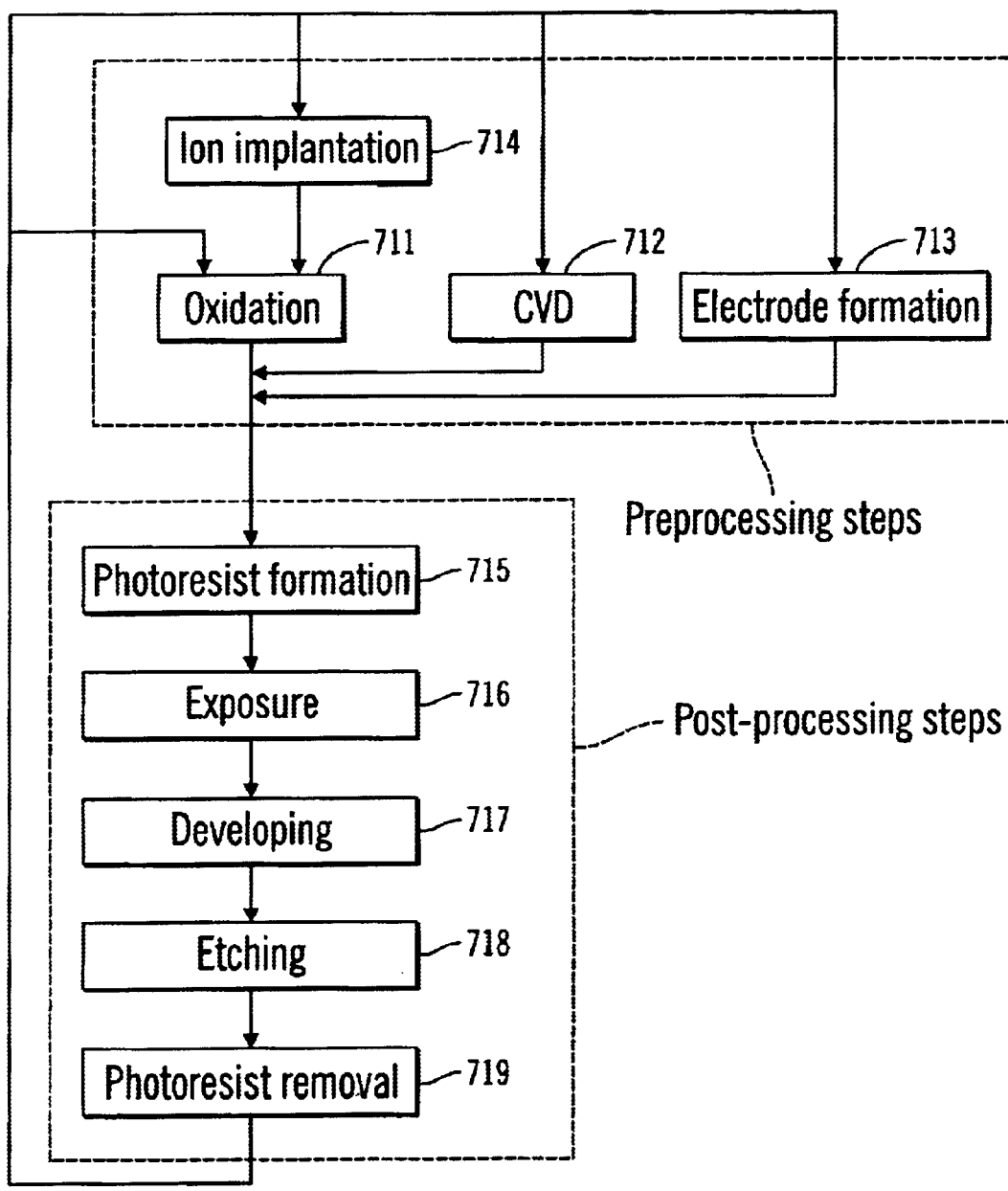
FIG. 7 is a detailed block diagram of fabricating semiconductor devices.

FIG. 7 illustrates a detailed flowchart example of the above-mentioned step 704 in the case of fabricating semiconductor devices. In FIG. 7, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion implantation step), ions are implanted in the wafer. The above-mentioned steps 711–714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure device is used to transfer the circuit pattern of a mask (reticle) to a wafer. Then, in step 717 (developing step), the exposed wafer is developed, and in step 718 (etching step), parts other than residual photoresist (exposed material surface) are removed by etching. In step 719 (photoresist removal step), unnecessary photoresist remaining after etching is removed.

Multiple circuit patterns are formed by repetition of these preprocessing and post-processing steps.

It is to be understood that the photolithography system may be different than the one shown herein and other types of exposure apparatus may be implemented with the pin chuck of the present invention without departing from the scope and spirit of the invention.

While the present invention has been described with respect to the preferred embodiments in accordance therewith, it will be apparent to those in the skilled art that various modifications and improvements may be made without departing from the scope and spirit of the invention. Accordingly, the disclosed invention is to be considered merely as illustrative and limited in scope only as specified in the appended claims.

I claim:

1. A chuck for supporting a substrate during processing comprising:
   a base with a upper surface;
   a plurality of support pins extending from said the upper surface for supporting said substrate;
   a gas inlet located near or at a center of the base below said substrate;
   an annular array of gas inlets located around the center of said base and on the upper surface of said base;
   wherein the position of the annular array is chosen such that the distribution of a gas through said gas inlets produces a relatively uniform gas pressure below said substrate.

2. A chuck according to claim 1, further comprising a groove defined in the base in which said annular array is located.

3. A chuck according to claim 1 further comprising:
   an annular set of openings located toward the periphery of said base;
   wherein the gas is extracted via said annular set of openings from a space between said upper surface and said substrate.

4. A chuck according to claim 3 further comprising:

an annular rim located toward the periphery of said base;

wherein the height of said rim is lower than the height of said supporting pins.

5. A chunk according to claim 4 wherein the annular rim is located toward the periphery of said base but outside said annular array.

6. A chuck for supporting a substrate during processing comprising:

a base with an upper surface;

a plurality of support pins extending from said the upper surface for supporting said substrate;

a gas inlet located near or at a center of the base below said substrate;

an annular array of gas inlets located around the center of said base and on the upper surface of said base, wherein the position of the annular array is chosen such that the distribution of a gas through said gas inlets produces a relatively uniform gas pressure below said substrate;

an annular set of openings located toward the periphery of said base, wherein the gas is extracted via said annular set of openings from a space between said upper surface an said substrate; and an annular rim located toward the periphery of said base, wherein the height of said rim is lower than the height of said supporting pins.

7. A chuck a cording to claim 6 wherein the annular rim is located toward the periphery of said base but outside said annular array.

* * * * *

UNITED STATES PATENT AND TRADEMARK OFFICE
CERTIFICATE OF CORRECTION

PATENT NO.    : 6,628,503 B2
DATED         : September 30, 2003
INVENTOR(S)   : Sogard It is certified that error appears in the above-identified patent and that said Letters Patent is hereby corrected as shown below:

<u>Column 10,</u>
Line 7, after "surface", "an" should read -- and --.

Signed and Sealed this

Thirteenth Day of January, 2004

JON W. DUDAS
*Acting Director of the United States Patent and Trademark Office*